(12) United States Patent
Ikeda et al.

(10) Patent No.: US 12,287,025 B2
(45) Date of Patent: Apr. 29, 2025

(54) BOOSTER LEVER UNIT

(71) Applicant: Hitachi, Ltd., Tokyo (JP)

(72) Inventors: Sho Ikeda, Tokyo (JP); Akihiro Adachi, Kanagawa (JP); Osamu Kamimura, Tokyo (JP); Kenichi Miyamoto, Tokyo (JP); Yosuke Ishida, Kanagawa (JP)

(73) Assignee: HITACHI VANTARA, LTD., Kanagawa-ken (JP)

( * ) Notice: Subject to any disclaimer, the term of this patent is extended or adjusted under 35 U.S.C. 154(b) by 408 days.

(21) Appl. No.: 17/900,238

(22) Filed: Aug. 31, 2022

(65) Prior Publication Data

US 2023/0332674 A1 Oct. 19, 2023

(30) Foreign Application Priority Data

Apr. 13, 2022 (JP) ................. 2022-066210

(51) Int. Cl.
*F16H 21/44* (2006.01)
*H01R 13/629* (2006.01)
(Continued)

(52) U.S. Cl.
CPC ....... *F16H 21/44* (2013.01); *H01R 13/62905* (2013.01); *H01R 13/62933* (2013.01); *H01R 13/62955* (2013.01); *H01R 13/62966* (2013.01); *H01R 13/62972* (2013.01); *H05K 7/1489* (2013.01); *F16H 21/10* (2013.01); *G11B 33/12* (2013.01); *G11B 33/125* (2013.01); *G11B 33/127* (2013.01); *G11B 33/128* (2013.01); *H01R 13/629* (2013.01);
(Continued)

(58) Field of Classification Search
CPC ... F16H 21/44; F16H 21/10; H01R 13/62905; H01R 13/62933; H01R 13/62955; H01R 13/62966; H01R 13/62972; H01R 13/629; H01R 13/62911; H01R 13/62916; H01R 13/62922; H01R 13/62927; H01R 13/62938; H05K 7/1489; H05K 7/1401; H05K 7/1402; H05K 7/1488; H05K 7/1409; G11B 33/12; G11B 33/125; G11B 33/127; G11B 33/128
See application file for complete search history.

(56) References Cited

FOREIGN PATENT DOCUMENTS

DE 19542229 A1 * 5/1997 ............. F16H 21/10
JP 2015-205353 A 11/2015

* cited by examiner

*Primary Examiner* — Justin M Kratt
(74) *Attorney, Agent, or Firm* — Procopio, Cory, Hargreaves & Savitch LLP

(57) ABSTRACT

A booster lever unit includes a first lever pivotably supported by an object via a first pivotal shaft, a second lever pivotably supported by the object via a second pivotal shaft, and a linkage member that links the first lever to the second lever. The pivotal plane of the first lever is parallel to the pivotal plane of the second lever. The first lever has one end provided with an operation section, and another end provided with the first pivotal shaft, and the first lever further includes a first linker, the first linker being provided between the operation section and the first pivotal shaft and linked to the linkage member. The second lever has one end provided with an action section, and another end provided with a second linker linked to the linkage member, and the second pivotal shaft is provided between the action section and the second linker.

5 Claims, 7 Drawing Sheets

(51) Int. Cl.
*H05K 7/14* (2006.01)
*F16H 21/10* (2006.01)
*G11B 33/12* (2006.01)

(52) U.S. Cl.
CPC .. *H01R 13/62911* (2013.01); *H01R 13/62916* (2013.01); *H01R 13/62922* (2013.01); *H01R 13/62927* (2013.01); *H01R 13/62938* (2013.01); *H05K 7/1401* (2013.01); *H05K 7/1402* (2013.01); *H05K 7/1409* (2013.01); *H05K 7/1488* (2013.01)

○ LEVER CONFIGURATION:

○ PIN-LINKER CONFIGURATION:

US 12,287,025 B2

BOOSTER LEVER UNIT

BACKGROUND OF THE INVENTION

Field of the Invention

The present invention relates to a booster lever unit.

Description of the Related Art

There is a related-art technology relating to the combination of multiple force boosting mechanisms described in Japanese Patent No. 6,201,874. Japanese Patent No. 6,201,874 describes "an assembly apparatus provide with a linear motion section that performs a linear reciprocating motion relative to a body section with the aid of a pivotable operation lever, and the apparatus includes a first link mechanism including a first link rod having one end supported by the body section via a first shaft and a second link rod having one end supported by the linear motion section via a second shaft, the other end of the first link rod and the other end of the second link rod being supported via a third shaft, and a second link mechanism including the operation lever disposed between the first shaft and the second shaft and having a base end supported via a fourth shaft provided at the body section, a third link rod having one end fixed to the operation lever in the middle thereof, and a fourth link rod having one end supported via the third shaft section, the other end of the third link rod and the other end of the fourth link rod being supported via a fifth shaft".

In the related-art technology described above, in which the leverage mechanism is combined with the toggle mechanism, the entire structure is complicated, resulting in high cost and low flexibility in component arrangement. For example, when the force boosting mechanism is employed to insert and extract a controller into and from an electronic computer, it is necessary to provide a desired action length and action force in a limited space in a standardized server rack. The related-art technology also has a cost constraint. In view of the facts described above, a force boosting lever unit having a simple structure and a high degree of freedom in component arrangement is required.

An object of the present invention is to provide a booster lever unit having a simple structure and a high degree of freedom in component arrangement.

SUMMARY OF THE INVENTION

To achieve the object described above, one representative booster lever unit according to the present invention includes a first lever pivotably supported by a predetermined object via a first pivotal shaft, a second lever pivotably supported by the predetermined object via a second pivotal shaft, and a linkage member that links the first lever and the second lever to each other. A pivotal plane of the first lever and a pivotal plane of the second lever are parallel to each other. The first lever has one end provided with an operation section, and another end provided with the first pivotal shaft, the first lever further has a first linker, the first linker being provided between the operation section and the first pivotal shaft and linked to the linkage member. The second lever has one end provided with an action section, and another end provided with a second linker linked to the linkage member, and the second pivotal shaft is provided between the action section and the second linker.

The present invention can provide a booster lever unit having a simple structure and a high degree of freedom in component arrangement. Objects, configurations, and effects other than those described above will be apparent from the following description of an embodiment.

DETAILED DESCRIPTION OF THE PREFERRED EMBODIMENTS

An embodiment will be described below with reference to the drawings.

An electronic computer using a lever unit will first be described with reference to FIGS. 1 to 3.

Figure 1:
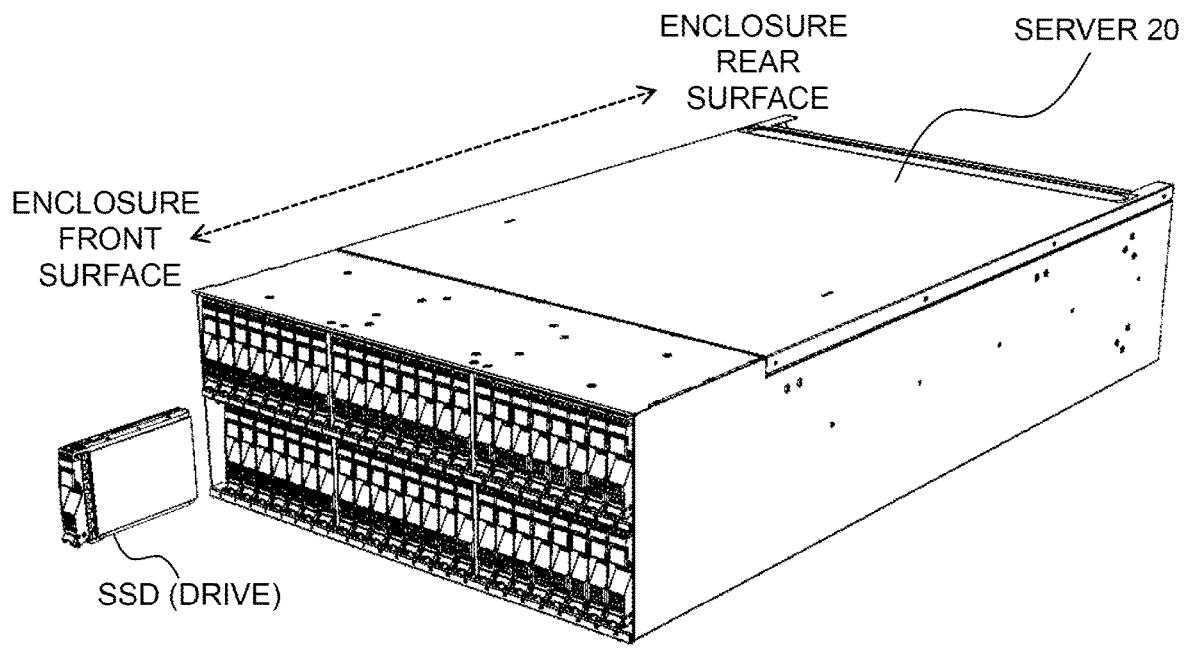
FIG. 1 is a diagram for describing an electronic computer using a lever unit (first diagram)
Figure 1:
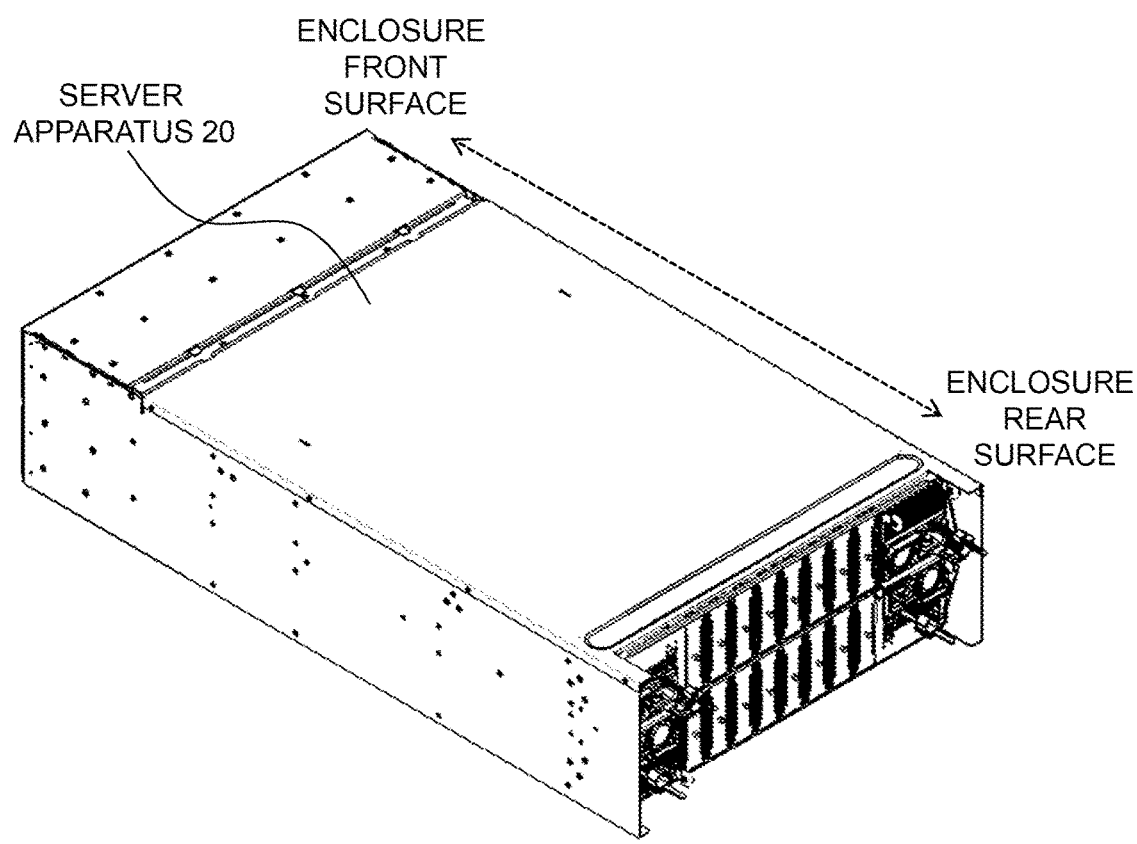

A plurality of storing apparatuses such as solid-state drives (SSDs) can be attached to an electronic computer 20 with the storage apparatuses mounted on the front side of an enclosure, as shown in FIG. 1. The electronic computer 20 is a storage apparatus, server apparatus, or any other apparatus.

Figure 2:
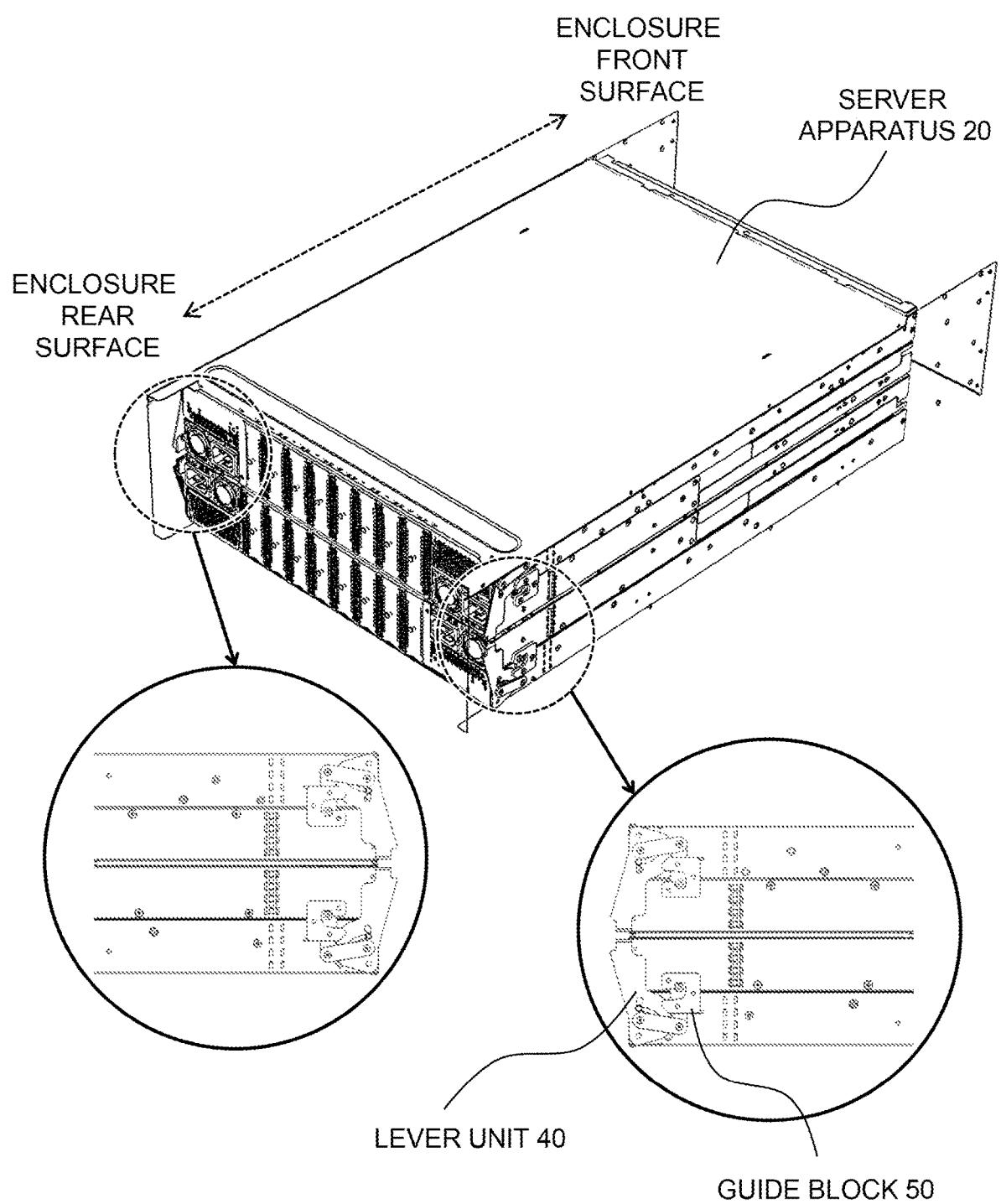
FIG. 2 is a diagram for describing the electronic computer using a lever unit (second diagram)

FIG. 2 is a perspective view of a chassis of the electronic computer 20 in FIG. 1. Lever units 40 and guide blocks 50 are provided on the rear side of the enclosure of the electronic computer 20, as shown in FIG. 2.

Figure 3:
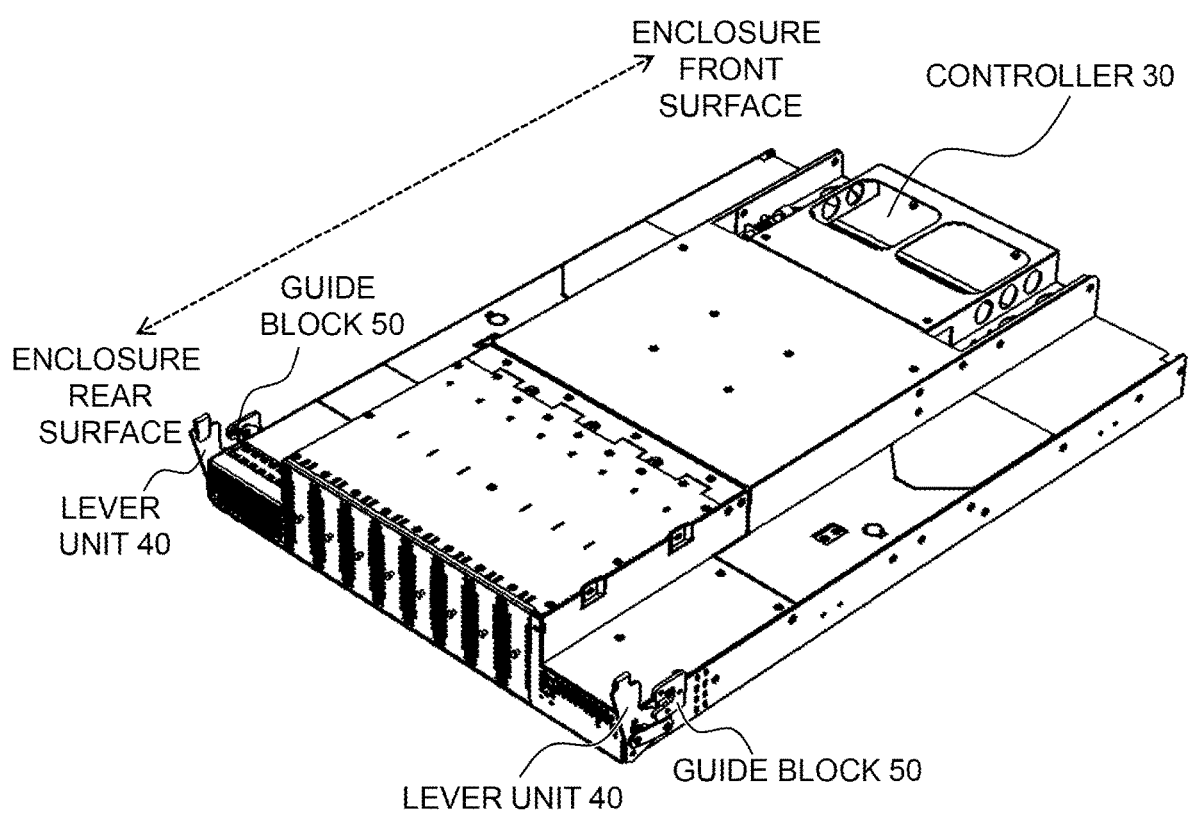
FIG. 3 is a diagram for describing the electronic computer using a lever unit (third diagram)

FIG. 3 shows a controller 30 of the electronic computer 20. The controller 30 can be inserted and extracted into and from the electronic computer 20. The lever units 40 are each a booster lever unit attached to the controller 30. The guide blocks 50 are each a guide member attached to the chassis of the electronic computer 20.

The controller 30 is equipped with a large number of connectors, and inserting and extracting the controller 30 requires a force that exceeds the engagement force associated with the connectors, and it is therefore difficult to insert and extract the controller 30 by simply pushing and pulling the controller 30.

The lever units 40 each have a force boosting mechanism, which acts on the guide block 50 to reduce the operation force required for the insertion and extraction of the controller 30. The controller 30 can thus be inserted and extracted without use of other tools.

Figure 4:
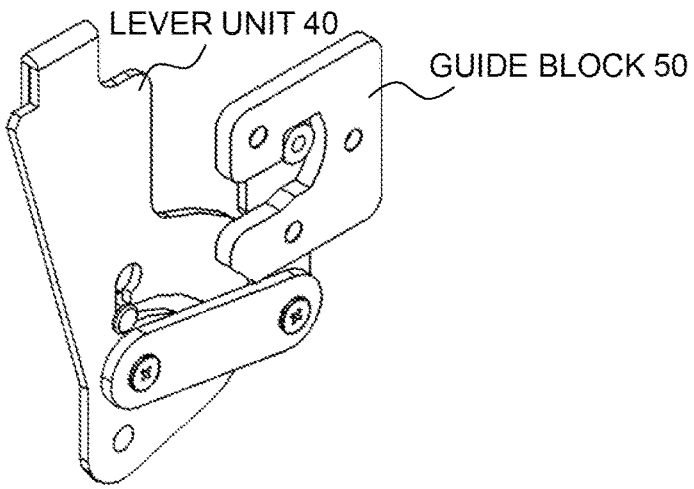
FIG. 4 is a diagram for describing the structure of the lever unit (first diagram)
Figure 4:
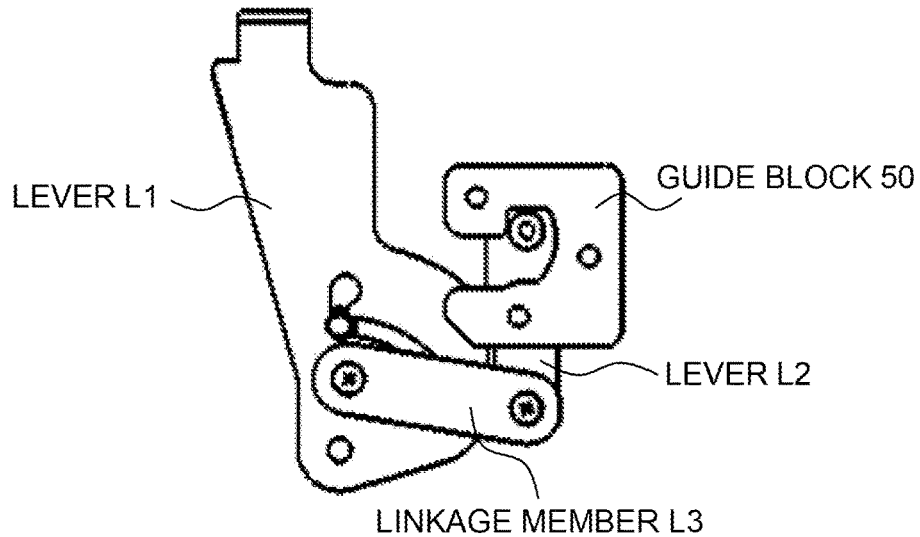
Figure 4:
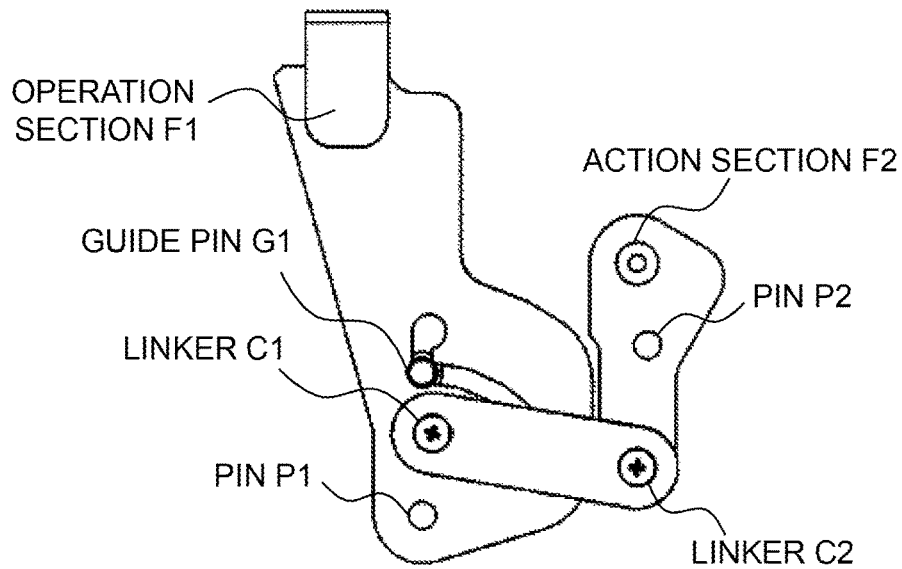
Figure 5:
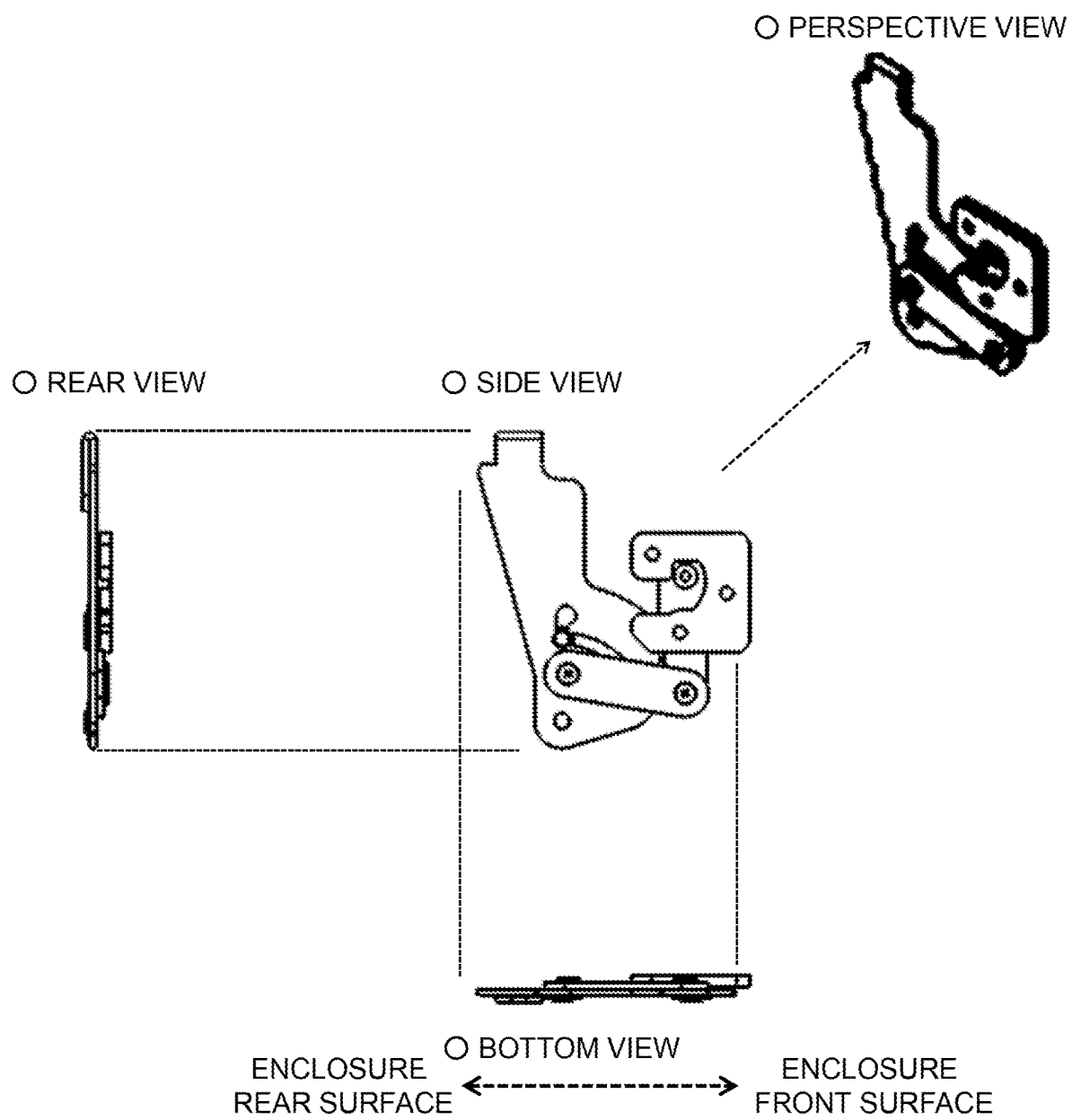
FIG. 5 is a diagram for describing the structure of the lever unit (second diagram)

FIGS. 4 and 5 show the configuration of each of the lever units 40.

The lever unit 40 includes a lever L1, a lever L2, and a linkage member L3, as shown in FIG. 4. The lever 1 is a first lever. The lever 2 is a second lever. The linkage member L3 links the lever L1 and the lever L2 to each other.

The lever L1 is pivotably supported by the controller 30 via a pin P1, which is a first pivotal shaft. The lever L2 is pivotably supported by the controller 30 via a pin P2, which is a second pivotal shaft. The pivotal planes of the levers L1 and L2 are parallel to each other.

The lever L1 has one end provided with an operation section F1 and another end supported by the pin P1. A linker C1, which is linked to the linkage member L3, is provided between the operation section F1 and the pin P1. Furthermore, a groove is formed in the lever L1, and a guide pin G1 fixed to the controller 30 fits into the groove of the lever L1, restricting the range over which the lever L1 pivots.

The lever L2 has one end provided with an action section F2 and another end provided with a linker C2, which is linked to the linkage member L3. The pin P2 is located between the action section F2 and the linker C2.

FIG. 5 includes a side view, a rear view, a bottom view, and a perspective view of the lever unit 40 and the guide block 50. The lever L1, the lever L2, the linkage member L3, and the guide block 50 are each formed as a plate-shaped part parallel to the pivotal plane of the lever L1. The lever unit 40 can therefore be freely disposed as long as there is a space having at least the total thickness of the plate-shaped parts described above, as shown in the rear and bottom views.

Figure 6:
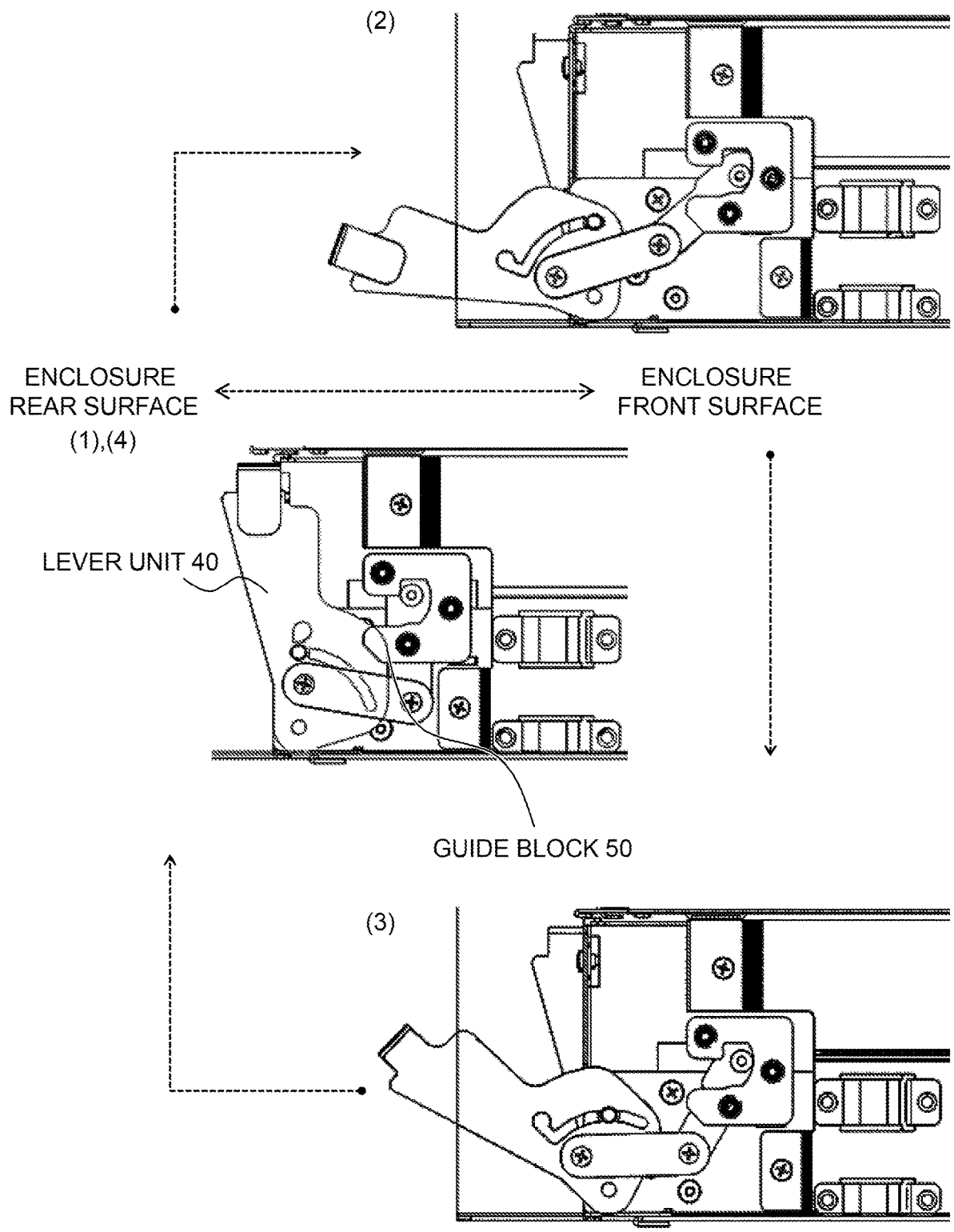
FIG. 6 is a diagram for describing the action of the lever unit (first diagram)
Figure 7:
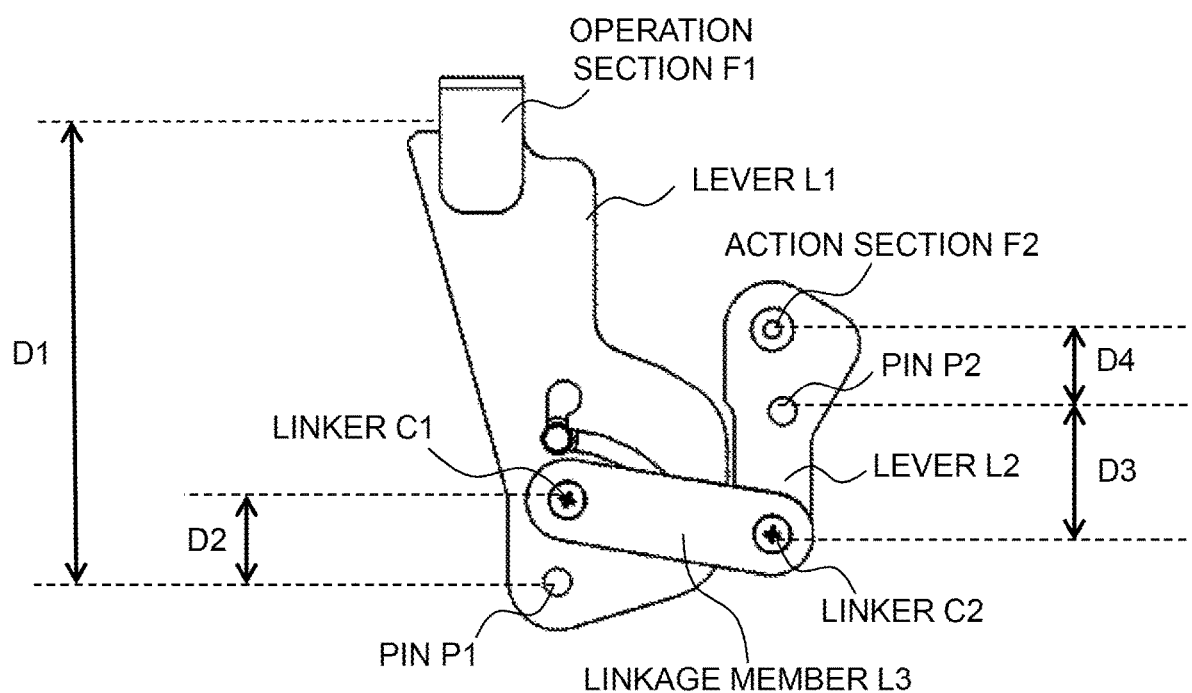
FIG. 7 is a diagram for describing the action of the lever unit (second diagram).

FIGS. 6 and 7 are diagrams for describing the action of the lever unit 40. FIG. 6(1) shows the state in which the controller 30 is incorporated in the chassis of the electronic computer 20. In this state, the lever L1 is in a standing position. The longitudinal direction of the lever L1 in the standing position is parallel to the thickness direction of the controller 30, and the length of the lever L1 is equal to or smaller than the thickness of the controller 30, so that the standing lever L1 is stored in the chassis.

To extract the controller 30 from the state shown in FIG. 6(1), an operation force is applied to the operation section F1 of the lever L1 so as to tilt the lever L1 away from the chassis, as shown in FIG. 6(2). This operation causes the lever L1 to pivot in such a way that the longitudinal direction is perpendicular to the thickness direction of the controller 30. As a result, the action section F2 of the lever L2 generates a force that pushes the guide block 50 via the lever L1 and the linkage member L3. The direction in which the action section F2 of the lever L2 pushes the guide block 50 is the direction in which the action section F2 causes the guide block 50 to move away from the lever L1. The pushing force disengages the connector of the controller 30 and realizes the action of extracting the controller 30.

To incorporate the controller 30 from the state shown in FIG. 6 (2), the controller 30 is inserted into the chassis with the lever L1 in a collapsed position (with longitudinal direction of lever L1 caused to pivot toward the side where longitudinal direction is perpendicular to thickness direction of controller 30), as shown in FIG. 6(3). The lever L1 then rises up as the action section F2 fits into the guide block 50 and is pushed.

When the lever L1 is further raised with the lever L1 slightly raised, as shown in FIG. 6(3), the action section F2 pulls the guide block 50, so that the controller 30 is inserted further into the chassis and the connectors engage with the counterpart, as shown in FIG. 6(4). The operation of raising the lever L1 is the operation of causing the lever L1 to pivot in such a way that the lever L1 is parallel to the thickness direction of the controller 30. When the action section F2 pulls the guide block 50, the guide block 50 is pulled in the direction in which the guide block 50 approaches the lever L1, and the connectors of the controller 30 engage with the counterpart, so that the action of inserting the controller 30 is realized.

FIG. 7 is a diagram for describing amplification achieved by the lever unit 40.

In FIG. 7, let D1 be the distance from the pin P1, which is the pivotal shaft of the lever L1, to the operation section F1, and D2 be the distance from the pin P1 to the linker C1. Since the operation section F1 acts as the point to which the force is applied, the pin P1 acts as the fulcrum, and the linker C1 acts as the point of action, the lever L1 performs amplification of D1/D2.

Furthermore, in FIG. 7, let D4 be the distance from the pin P2, which is the pivotal shaft of the lever L2, to the action section F2, and D3 be the distance from the pin P2 to the linker C2. Since the linker C2 acts as the point to which the force is applied, the pin P2 acts as the fulcrum, and the action section F2 acts as the point of action, the lever L2 performs amplification of D3/D4.

The lever unit 40 thus as a whole performs amplification of (D1/D2)×(D3/D4). Note that the linkage member L3 does not contribute to the amplification of the operation force but provides the function of reversing the direction of action and further increases the degree of freedom in the positional relationship between the levers L1 and L2.

Since almost the entire length of the lever L1 can be used as the distance D1 from the point to which the force is applied to the fulcrum, the amplification ratio can still be sufficient even when the length of the lever L1 is equal to or smaller than the thickness of the controller 30.

The shapes, sizes, inter-part linkage, and other structures of the lever L1, the lever L2, and the linkage member L3 are so determined that the requirements of the action length and the action force are satisfied. The requirement for the action length of the action section F2 is as follows: The action length is equal to or larger than the engagement length of the connectors of the controller 30. The requirement for the action force produced by the action section F2 is as follows: The action force satisfies the engagement force required by the connectors when an operation force equal to or smaller than a predetermined value is applied to the operation section F1. A structure that satisfies these requirements is feasible because the lever unit 40 is sufficiently thin and has a high degree of structural freedom.

As described above, the disclosed lever unit 40 is a booster lever unit including a two-stage leverage mechanism, and includes the lever L1, which serves as the first lever and is pivotably supported by a predetermined object via the first pivotal shaft (pin P1), the lever L2, which serves as the second lever and is pivotably supported by the predetermined object via the second pivotal shaft (pin P2), and the linkage member L3, which links the first lever and the second lever to each other.

The pivotal planes of the first and second levers are parallel to each other, the first lever has one end provided with the operation section F1 and another end provided with the first pivotal shaft, and the linker C1, which is a first linker linked to the linkage member L3, is provided between the operation section F1 and the first pivotal shaft.

The second lever has one end provided with the action section F2 and another end provided with the linker C2, which is a second linker linked to the linkage member described above, and the second pivotal axis is provided between the action section F2 and the second linker.

The structure described above allows a booster lever unit having a simple structure and a high degree of freedom in component arrangement to be provided.

The predetermined object is the controller of the electronic computer 20, and the action section F2 acts on the guide block 50, which is the guide member provided in the chassis of the electronic computer 20, to insert and extract the controller 30.

The action length of the action section F2 is equal to or larger than the engagement length of the connectors of the controller 30, and the action force produced by the action section F2 satisfies the engagement force required by the connectors when an operation force equal to or smaller than a predetermined value is applied to the operation section F1.

According to this example, the disclosed booster lever unit allows the controller 30 of the electronic computer 20 to be inserted and extracted without use of other tools.

Furthermore, as an example, the first lever is pivotable in the thickness direction of the controller 30, and the length of the first lever is equal to or smaller than the thickness of the controller 30.

When the first lever is caused to pivot so as to be parallel to the thickness direction described above, the action section F2 pulls the guide member in the direction in which the guide member approaches the first lever, to realize the action of inserting the controller 30, and when the first lever is caused to pivot so as to be perpendicular to the thickness direction described above, the action section F2 pushes the guide member in the direction in which the guide member moves away from the first lever, to realize the action of extracting the controller 30.

According to this example, even a short first lever can provide sufficient amplification, and the first lever can be stored in the electronic computer 20 with the controller 30 inserted thereinto.

The first lever, the second lever, and the linkage member may each be a plate-shaped part parallel to the pivotal plane of the first lever.

Employing the structure described above can provide a booster lever unit that can be placed in a small space. The present invention is not limited to the embodiment described above and includes a variety of variations. For example, the aforementioned embodiment has been described in detail to describe the present invention in an easy-to-understand manner, and does not necessarily include all the configurations described above. Any of the configurations can be deleted or replaced, and any configuration can be added.

REFERENCE SINGS LIST

20: Electronic computer, 30: Controller, 40: Lever unit, 50: Guide block, C1: Liker, C2: Liker, D1: Distance, F1: Operation section, F2: Action section, G1: Guide pin, L1: Lever, L2: Lever, L3: Linkage member, P1: Pin, P2: pin

What is claimed is:

1. A booster lever unit comprising:
   a first lever pivotably supported by a predetermined object via a first pivotal shaft;
   a second lever pivotably supported by the predetermined object via a second pivotal shaft; and
   a linkage member that links the first lever and the second lever to each other, wherein
   a pivotal plane of the first lever and a pivotal plane of the second lever are parallel to each other,
   the first lever has:
     one end provided with an operation section, and
     another end provided with the first pivotal shaft,
   the first lever further has a first linker, the first linker being provided between the operation section and the first pivotal shaft and linked to the linkage member,
   the second lever has:
     one end provided with an action section, and
     another end provided with a second linker linked to the linkage member,
   the second pivotal shaft is provided between the action section and the second linker,
   the predetermined object is a controller of an electronic computer, and
   the action section acts on a guide member provided in a chassis of the electronic computer to insert and extract the controller.

2. The booster lever unit according to claim 1, wherein an action length of the action section is equal to or larger than an engagement length of a connector of the controller, and
an action force produced by the action section satisfies an engagement force required by the connector when an operating force equal to or smaller than a predetermined value is applied to the operation section.

3. The booster lever unit according to claim 1, wherein the first lever is pivotable in a thickness direction of the controller, and
a length of the first lever is equal to or smaller than a thickness of the controller.

4. The booster lever unit according to claim 3, wherein when the first lever is caused to pivot so as to be parallel to the thickness direction, the action section pulls the guide member in a direction in which the guide member approaches the first lever, to realize the action of inserting the controller, and
when the first lever is caused to pivot so as to be perpendicular to the thickness direction, the action section pushes the guide member in a direction in which the guide member moves away from the first lever, to realize the action of extracting the controller.

5. The booster lever unit according to claim 1, wherein the first lever, the second lever, and the linkage member are each a plate-shaped part parallel to the pivotal plane of the first lever.

* * * * *